United States Patent [19]
Sathe et al.

[11] Patent Number: 5,654,876
[45] Date of Patent: Aug. 5, 1997

[54] DEMOUNTABLE HEAT SINK

[75] Inventors: Sanjeev Balwant Sathe, Johnson City, N.Y.; Pratap Singh, Round Rock, Tex.

[73] Assignee: International Business Machines Corporation, Armonk, N.Y.

[21] Appl. No.: 583,322

[22] Filed: Jan. 5, 1996

[51] Int. Cl.$^6$ .................................................... H05M 7/20
[52] U.S. Cl. ................................. 361/704; 257/718
[58] Field of Search .................... 165/80.2, 80.3, 165/185; 174/16.3; 257/707, 712–713, 718, 719, 726, 727; 361/690, 704, 707, 709–722

[56] References Cited

U.S. PATENT DOCUMENTS

| | | |
|---|---|---|
| 3,867,003 | 2/1975 | Morton et al. . |
| 4,068,368 | 1/1978 | DeBard et al. . |
| 4,333,101 | 6/1982 | York . |
| 4,628,990 | 12/1986 | Hagihara et al. . |
| 4,636,580 | 1/1987 | Neidig et al. . |
| 5,305,185 | 4/1994 | Samarov et al. ............ 257/719 |

FOREIGN PATENT DOCUMENTS 4186752  7/1992  Japan ................................. 257/718

OTHER PUBLICATIONS

IBM TDB, "Double–Sided, Replaceable, Dendrite–Plated Interpose for Connector Applications", Oct. 1994, vol. 37, No. 10, pp. 35–36.

*Primary Examiner*—Gregory D. Thompson
*Attorney, Agent, or Firm*—Richard A. Henkler

[57] ABSTRACT

A demountable, and thus re-usable, conductive heat sink for dissipation of excess heat of an electronic component. The heat sink uses a T-bolt and T-slot for attachment to the electronic component and the printed circuit board, respectively. This attachment eliminates the typical concerns associated with the placement of traces on the PCB to accommodate the holes placed therein for the attachment of conventional heat sinks. The improved designed also facilitates demounting of the heat sink from the printed circuit board and the electronic component without damage thereto.

13 Claims, 2 Drawing Sheets

DEMOUNTABLE HEAT SINK

BACKGROUND

1. Field of the Present Invention

The present invention generally relates to heat sinks, and more specifically, to demountable conducting heat sinks for electronic components containing semiconductor devices.

2. History of Related Art

In today's modern electronic industry, many of the electronic components generate excess heat which must be dissipated in some fashion. The dissipation of this excess heat is, typically, accomplished by attaching a heat sink to the electronic component. Heat sinks, which are relatively small in size, use some type of thermal adhesive for their attachment to the electronic component. Heat sinks, which are relatively large in size, use a demountable scheme having a thermal compound located between the heat sink and the electronic component. A typical demountable scheme may use, for example, a nut and bolt, or clip. Unfortunately, the types of demountable heat sinks currently used by the industry have several problems associated with them. First, it is well understood by those of ordinary skill in the art that whenever an electronic component is assembled using a solder column or solder ball attachment to a Printed Circuit Board (PCB), a good thermal interface between the heat sink and the electronic component must be established. This is usually accomplished by applying force to the connection there between via a nut and bolt or clip. When excessive force is used in establishing the interface, damage to the solder ball or column may be occur. Secondly, many of the currently used heat sinks require the drilling of holes through the PCB in order to accommodate the nut and bolt attachment mechanism. This procedure unnecessarily complicates the routing of the various traces on the PCB, and in some cases, may result in a less desirable design. Thirdly, the methods currently used for demounting the heat sink, which has been attached to the electronic component using an adhesive, often results in damage to the heat sink, electronic component, and/or PCB.

It would, therefore, be a distinct advantage to have a demountable heat sink that would eliminate the concern of applying excessive force in establishing the interface between the heat sink and the electronic component, which would attach to the PCB without requiring the drilling of holes for the attachment, and which would be removable, and therefore re-usable, without damage to the heat sink, PCB, and/or electronic component.

SUMMARY OF THE PRESENT INVENTION

In one aspect the present invention is a heat sink for dissipating excess heat from an electronic component mounted to a printed circuit board. The heat sink includes fastening means having an upper and lower attachment means. The heat sink further includes retaining means, attached to the surface of the printed circuit board, for receiving and retaining the lower attachment means. The heat sink also includes heat dissipation means for dissipating excess heat from the electronic component. The heat dissipation means having receiving means for receiving the upper attachment means. The heat sink further including securing means for securing the upper attachment means to the heat sink.

In yet another aspect, the present invention is a method of attaching a heat sink to an electronic component mounted to a printed circuit board. The method includes the steps of attaching the electronic component to the printed circuit board, and attaching retaining means, for receiving and retaining a lower attachment means, to the surface of the printed circuit board. The method further includes the steps of inserting lower attachment means of a fastening means into the retaining means, and inserting upper attachment means of the fastening means into a receiving means of the heat sink. The method also includes the step of securing the fastening means to the heat sink with securing means, thereby attaching the heat sink to the electronic component and the printed circuit board.

BRIEF DESCRIPTION OF THE DRAWINGS

The present invention will be better understood and its numerous objects and advantages will become more apparent to those skilled in the art by reference to the following drawings, in conjunction with the accompanying specification, in which.

DETAILED DESCRIPTION OF THE PREFERRED EMBODIMENT OF THE PRESENT INVENTION

Figure 1:
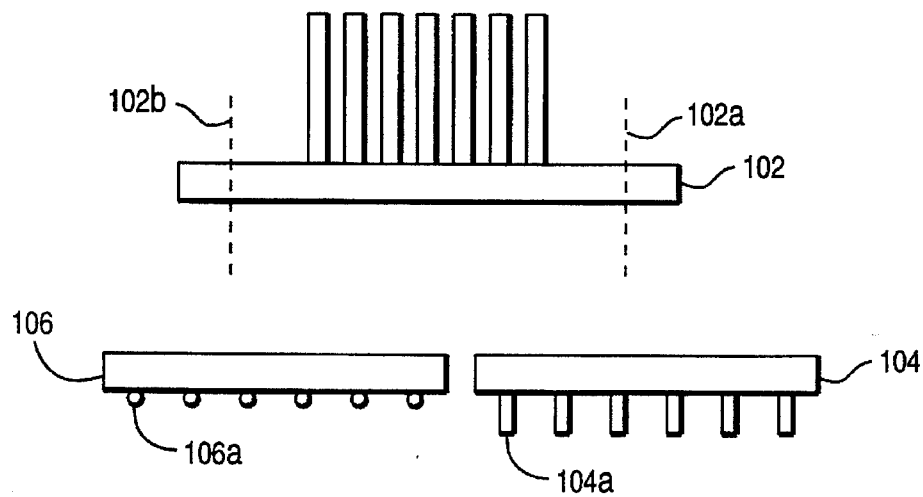
FIG. 1 is a diagram of a heat sink and two electronic components according to the teachings of the present invention.

Reference now being made to FIG. 1, a heat sink 102 and two electronic components 106 and 104 are shown according to the teachings of the present invention. Heat sink 102 includes four circular holes or other shaped holes (e.g. slots), two of which are shown and designated as 102a and 102b. The two electronic components 104 and 106 are illustrated as being attachable to a Printed Circuit Board (PCB), via a solder ball 106a or solder column 104a, respectively.

Figure 2:
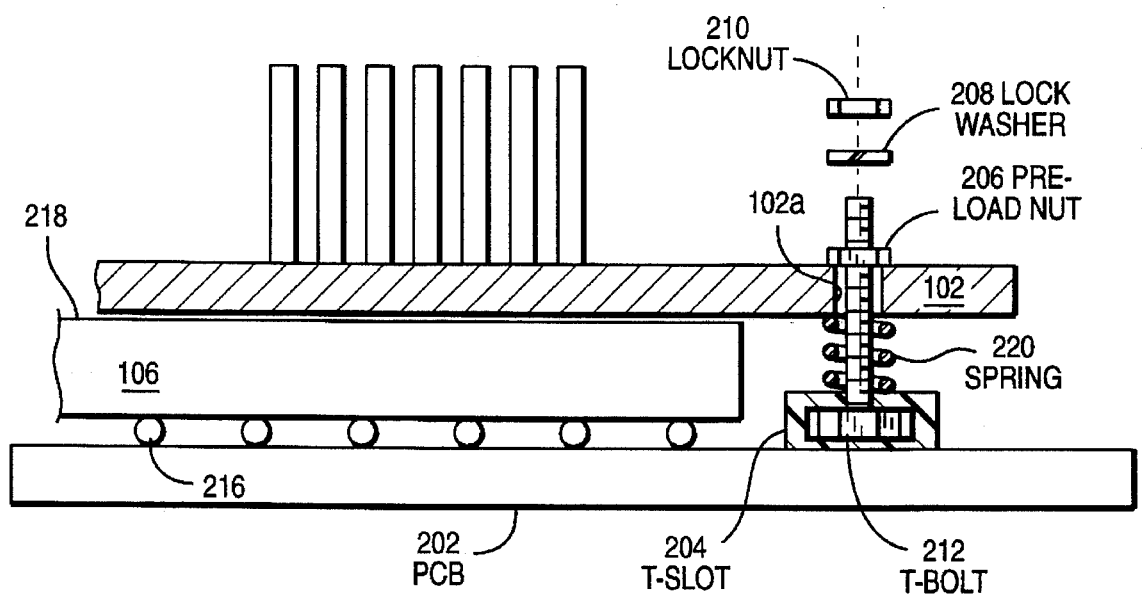
FIG. 2 is a diagram illustrating the heat sink attached to the electronic component of FIG. 1 and a printed circuit board according to the teachings of the present invention.

Reference now being made to FIG. 2, heat sink 102 is illustrated as being attached to the electronic component 106 of FIG. 1 and a printed circuit board 202 according to the teachings of the present invention. Although the heat sink 102 is shown as already being attached to electronic component 106 in FIG. 1 and PCB 202, it is beneficial, at this point, to discuss the method for the attachment of the heat sink 102 thereto.

Figure 3:
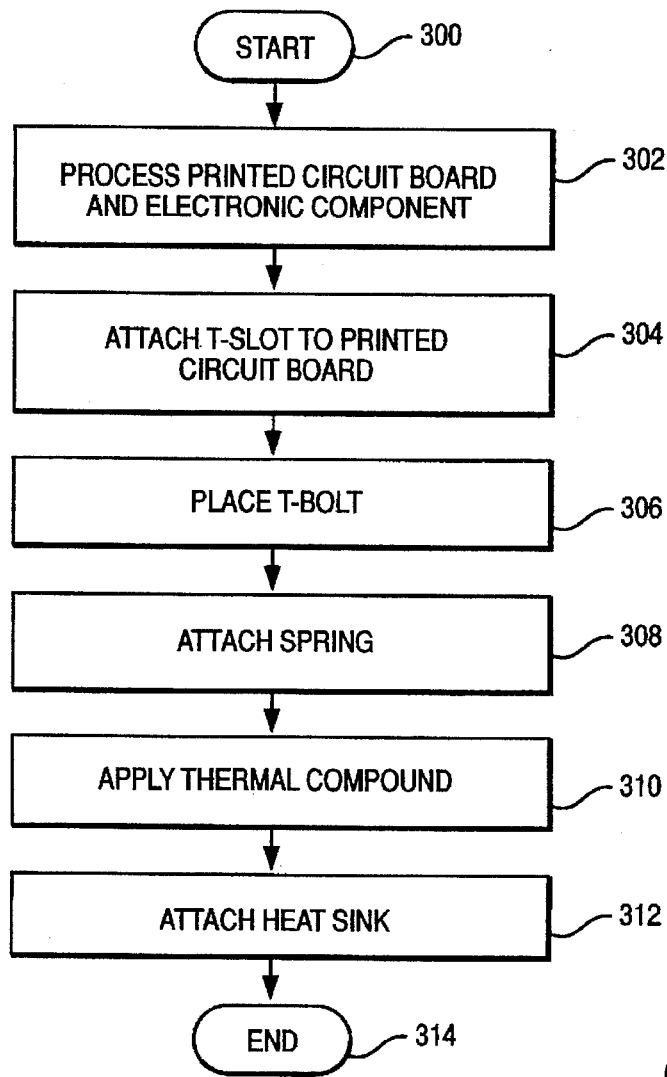
FIG. 3 is a flow chart comprising a method of attaching the heat sink of FIG. 1 to the electronic component and the printed circuit board of FIG. 2 according to the teachings of the present invention.

Reference now being made to FIG. 3, a flow chart is shown illustrating the method comprising the attachment of the heat sink 102 to the electronic component 106 and the PCB 202 of FIG. 2 according to the teachings of the present invention. The method begins at step 300 and proceeds to step 302 where the PCB 202 and the electronic component 106 are prepared for normal surface mount assembly. The methods used for the above preparation are well known and understood by those of ordinary skill in the art, and therefore, further discussion of the methods are deemed unnecessary. After the electronic component 106 and the PCB 202 have been prepared for surface mount, the method then proceeds to step 304 where the T-slot 204 is attached to the PCB 202. The method then proceeds to step 306 where the T-bolt 212 is placed in the T-slot 204. Thereafter, the method proceeds to step 308 where the spring 220 is placed on the T-bolt 212.

In an alternative embodiment, the spring 220 can be pre-attached to the T-bolt 212, thereby, eliminating the above step 308. The method then proceeds to step 310 where a thermal compound, such as thermal grease is applied to the surface of the electronic component 106 to which the heat sink 102 is to be attached. As shown in FIG. 2, the heat sink 102 is attached to the top portion of the electronic component 106 via thermal compound 218. Thereafter, the method proceeds to step 312 where the heat sink 102 is placed on top of the electronic component 106 so that the T-bolt 102 protrudes through the cylindrical or other shape hole 102a. A pre-load nut 206, a lock washer 208, and lock nut 210 are then placed on top of the T-bolt 202 to secure the heat sink 102, the electronic component 106, and the PCB 202. The method then proceeds to end at 314. It should also be noted that the number of T-slots used in order to properly mount the heat sink 102 to the PCB 202 is dependent upon the heat sink size, total force, and uniformity of pressure for the particular design.

Figure 4:
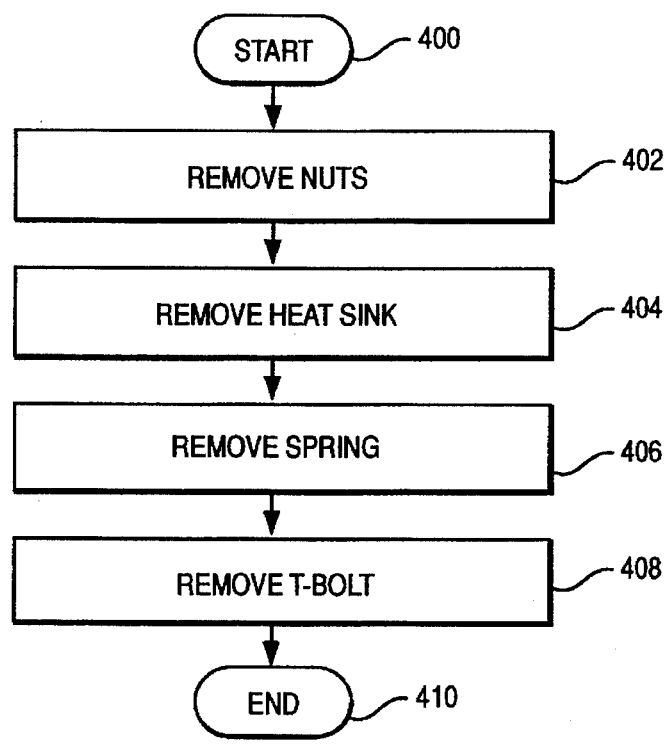
FIG. 4 is a flow chart comprising a method of demounting the heat sink from the electronic component and printed circuit board of FIG. 2 according to the teachings of the present invention.

Reference now being made to FIG. 4, a flow chart is shown comprising the method of demounting the heat sink 102 from the electronic component 106 and PCB 202 of FIG. 2 according to the teachings of the present invention. The method begins at step 400 and proceeds to step 402 where the lock nut 210, the lock washer 208 and the pre-load nut 206 are removed from the T-bolt 212. The method then proceeds to step 404 where the heat sink 102 is removed from the electronic component 106. Thereafter, the method proceeds to' step 406 where the spring 220 is removed from the T-bolt 212. The method then proceeds to step 408 where the T-bolt 212 is removed from the T-slot 204, and the method proceeds to end at step 410.

The above removal of the heat sink 102 provides the ability to repair and/or remove a defective electronic component 106. Thus, providing an efficient and effective method for re-use of the demountable heat sink 102. In the preferred embodiment of the present invention, a T-bolt 212 and T-slot 204 have been used to attach the heat sink 102 to the electronic component 106 and PCB 202. The selection of the T-shaped members (T-bolt 212 and T-slot 204) is preferable to other equivalent shapes as a result of cost and manufacturing perspectives, as well as the attachment and demounting of the heat sink 102. It should be clearly understood, however, that the scope of the present invention, is not intended to be in any way limited to the use of such T-shaped members, but in fact, may use any shape members. (e.g. square, semi-circle, triangle, or bolt threaded at two ends (functioning as T-bolt), and threaded flange nut (functioning as T-slot)) which essentially accomplish the same purpose of the T-shaped members.

It is thus believed that the operation and construction of the present invention will be apparent from the foregoing description. While the method and system shown and described has been characterized as being preferred, it will be readily apparent that various changes and/or modifications could be made wherein without departing from the spirit and scope of the present invention as defined in the following claims.

What is claimed is:

1. An apparatus comprising:
   a heat sink;
   a printed circuit board;
   a bolt having upper and lower portions;
   retaining means for retaining the lower portion, the retaining means including a non-threaded slot that allows the lower portion to be placed therein and retained from vertical movement via the dimensions of the slot, the retaining means being attached to the printed circuit board, and
   securing means for securing the heat sink to the upper portion, and for applying an upward force to the lower portion such that the lower portion is retained from horizontal movement via the non-threaded slot.

2. The apparatus of claim 1 further comprising:
   a spring residing between the retaining means and the bottom of the heat sink.

3. The apparatus of claim 2 wherein the non-threaded slot has a dimension that is substantially similar to that of the lower portion.

4. The apparatus of claim 3 wherein the upper and lower portions of the bolt are a threaded end and a T shaped end, respectively.

5. The apparatus of claim 4 wherein the non-threaded slot is T shaped.

6. The apparatus of claim 5 wherein the securing means is a nut and washer.

7. The apparatus of claim 1 wherein the heat sink is attached using a plurality of bolts, retaining means, and securing means.

8. A method of attaching a heat sink to an electronic component mounted to a printed circuit board, the method comprising the steps of:
   attaching the electronic component to the printed circuit board;
   attaching retaining means to the surface of the printed circuit board, the retaining means for receiving and retaining a lower portion of a bolt, the retaining means including a non-threaded slot that allows the lower portion to slide therein and be retained from vertical movement via the dimensions of the slot;
   inserting the lower portion of a bolt into the non-threaded slot;
   inserting the upper portion of the bolt into receiving means of the heat sink; and
   securing the bolt to the heat sink with securing means, thereby attaching the heat sink to the electronic component and the printed circuit board, the securing means retaining the lower portion from horizontal movement.

9. The method of claim 8 further comprising the step of:
   inserting a spring residing between the retaining means and the bottom of the heat sink.

10. The method of claim 9 wherein the non-threaded slot has a dimension that is substantially similar to that of the lower portion.

11. The method of claim 10 wherein the upper and lower portions of the bolt are a threaded end and a T shaped end, respectively.

12. The method of claim 11 wherein the non-threaded slot is T shaped.

13. The method of claim 12 wherein the securing means is a nut and washer.

* * * * *